United States Patent [19]
Wang

[11] Patent Number: 5,874,843
[45] Date of Patent: Feb. 23, 1999

[54] POWER-ON RESET CIRCUIT WITHOUT AN RC NETWORK

[75] Inventor: Shyh-Jye Wang, Hsinchu, Taiwan

[73] Assignee: Taiwan Semiconductor Manufacturing Co., Ltd., Hsinchu, Taiwan

[21] Appl. No.: 864,661

[22] Filed: May 28, 1997

[51] Int. Cl.⁶ .................................................. H03K 3/356
[52] U.S. Cl. .......................... 327/143; 327/199; 327/202
[58] Field of Search .................................... 327/199, 198, 327/142, 143, 202

[56] References Cited

U.S. PATENT DOCUMENTS

| | | | |
|---|---|---|---|
| 4,999,528 | 3/1991 | Keech | 307/279 |
| 5,081,377 | 1/1992 | Freyman | 307/480 |
| 5,239,206 | 8/1993 | Yanai | 307/272.2 |
| 5,317,205 | 5/1994 | Sato | 307/443 |
| 5,414,745 | 5/1995 | Lowe | 377/114 |
| 5,612,642 | 3/1997 | McClintock | 327/143 |

FOREIGN PATENT DOCUMENTS

| | | | |
|---|---|---|---|
| 0148364 A2 | 7/1985 | European Pat. Off. | 327/143 |
| 2128831 | 5/1984 | United Kingdom | 327/143 |

*Primary Examiner*—Timothy P. Callahan
*Assistant Examiner*—An T. Luu
*Attorney, Agent, or Firm*—Christensen O'Connor Johnson & Kindness PLLC

[57] ABSTRACT

A power-on reset circuit (28) is disclosed. The circuit includes a first stage circuit (30) and a second stage circuit (32). The first stage circuit includes an input terminal coupled to receive an input signal, a latch for detecting a power-on condition, and an output terminal for providing a first stage circuit output signal. The first stage circuit output signal remains in a first state after detection of the power-on condition. The second stage circuit includes an input terminal coupled to receive the first stage circuit output signal, a latch for detecting the power-on condition, and an output terminal for providing a second stage circuit output signal. The second stage circuit output signal remains in the first state after detection of the power-on condition. The first stage circuit output signal changes state from the first state to a second state when the input signal changes state from the second state to the first state, and the second stage circuit output signal changes state from the first state to the second state only the first time that the first stage circuit output signal changes state from the first state to the second state.

23 Claims, 4 Drawing Sheets

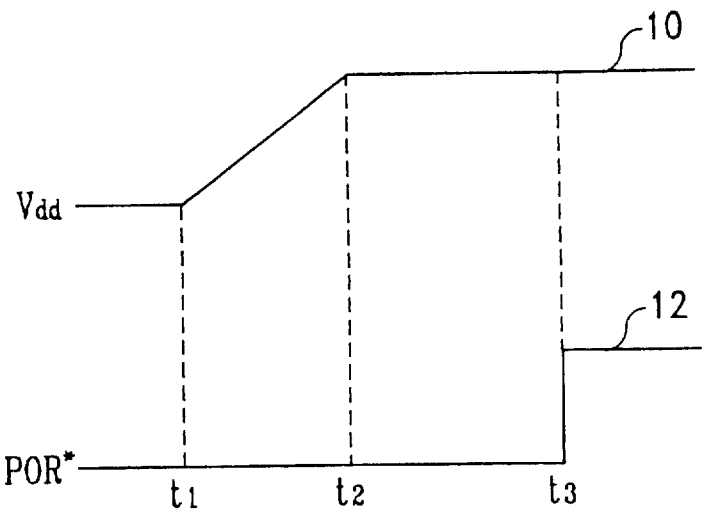
FIG.1A
(Prior Art)
FIG.1B
(Prior Art)
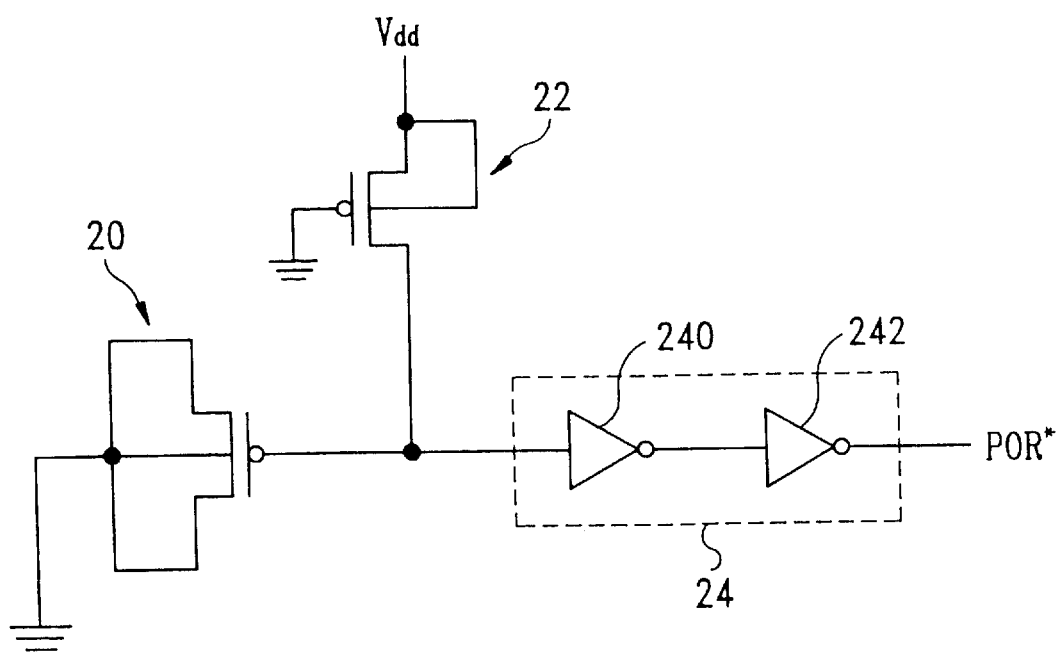
FIG.2
(Prior Art)

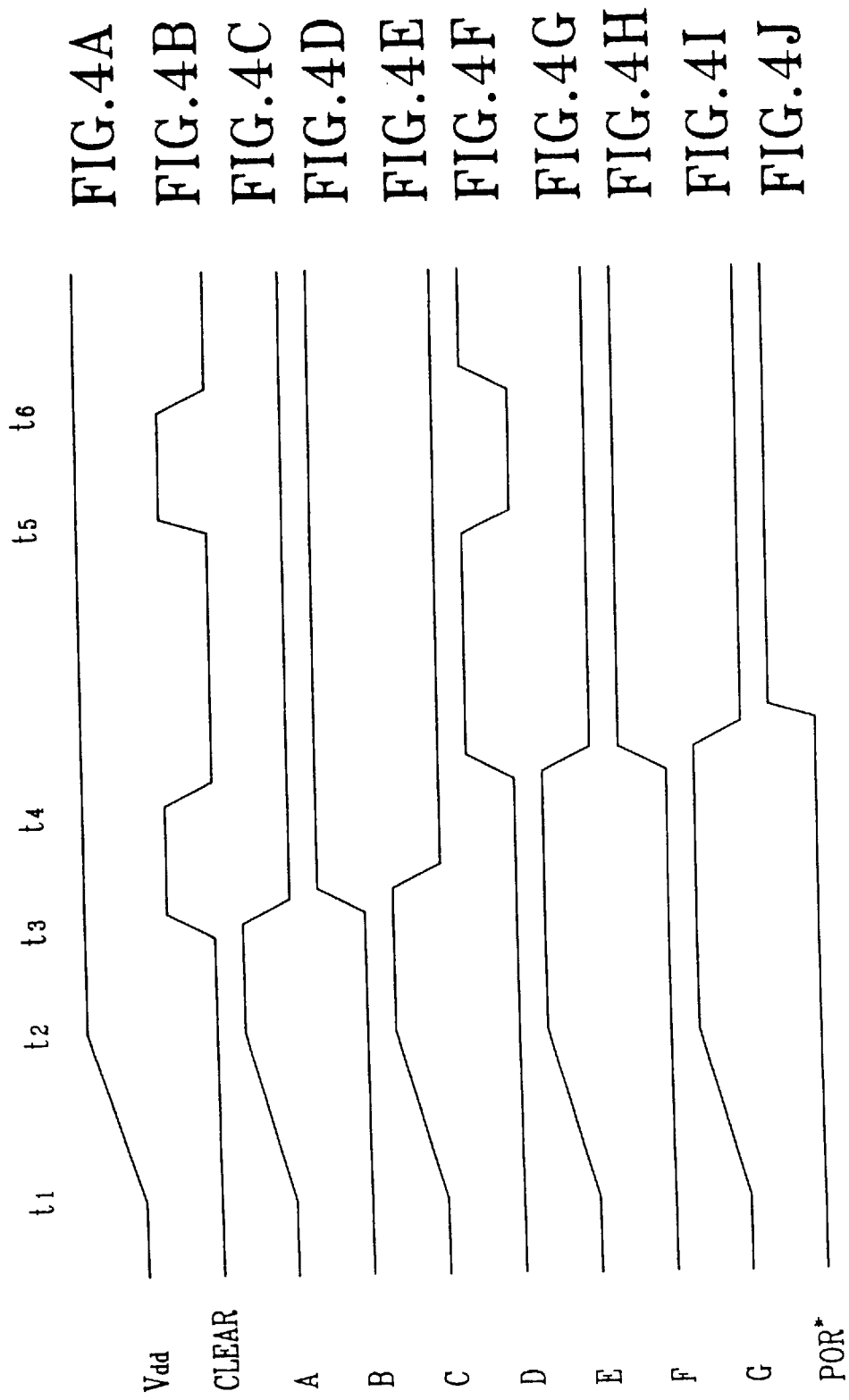

POWER-ON RESET CIRCUIT WITHOUT AN RC NETWORK

FIELD OF THE INVENTION

The present invention relates to a power-on reset circuit, and more particularly, to a power-on reset circuit without an RC network.

BACKGROUND OF THE INVENTION

A power-on reset (POR) circuit provides a reset signal for a subsystem, or subsystems, in a computer system. More specifically, a power-on reset output signal POR*, usually an active low signal, of the POR circuit is asserted low for a period of time when the power provided to the computer system is initially switched on. FIGS. 1A and 1B illustrate typical timing diagrams of power provided to a computer system and the signal POR*. The power provided to the computer system, for example $V_{dd}$, is represented by waveform 10 in FIG. 1A and switches on in a time period equal to $(t_2-t_1)$. The power-on reset output signal POR*, represented by waveform 12 in FIG. 1B, is necessarily asserted low in this same time period $(t_2-t_1)$. Further, the signal POR* is usually maintained in the active low state for another time period equal to $(t_3-t_2)$. In this time period $(t_3-t_2)$, a controller, such as a central processing unit (CPU), initiates its internal status, and some peripheral chips, such as a direct memory access (DMA) controller or a universal asynchronous receiver/transmitter (UART), clear their registers. A typical active time period, $(t_3-t_1)$ of the signal POR* is in the range of about 10 ms to 100 ms. This time period $(t_3-t_1)$ is long compared with the switching time of a metal oxide semiconductor (MOS) transistor (usually 0.0005 ms for a 0.5 $\mu$m process).

Power-on reset (POR) circuits known in the art are implemented either inside or outside a chip, depending on the particular application. For example, a conventional POR circuit for a CPU chip is built outside the CPU chip, while a POR circuit for a peripheral chip may be built either inside or outside the chip.

A conventional POR circuit includes an RC network to generate the signal POR*. For example, an RC circuit with a resistor having a value of about 1 Mohm and a capacitor having a value of about 0.1 $\mu$F will generate the signal POR* having an active time of about 82 ms. FIG. 2 shows a schematic diagram illustrating a typical POR circuit with an RC circuit fabricated in an integrated circuit. In the circuit of FIG. 2, a capacitor 20 is implemented with a p-type metal oxide semiconductor (PMOS) transistor having its source, drain, and substrate (or body) connected to ground. The capacitance of the capacitor 20 is determined by the size of the PMOS transistor used. More specifically, a PMOS transistor occupying more area results in a capacitor having more parasitic capacitance, that dominates the total capacitance. Moreover, the parasitic capacitance of a PMOS transistor is about three times the parasitic capacitance of an n-type metal oxide semiconductor (NMOS) transistor having the same size as the PMOS transistor. Therefore, the PMOS transistor is conventionally used as a capacitor instead of the NMOS transistor.

Still referring to FIG. 2, a resistor 22 is implemented with another PMOS transistor having its source and substrate connected to a supply line for voltage $V_{dd}$, and its gate connected to ground. The PMOS transistor 22 also has its drain connected to the gate of the PMOS transistor connected as the capacitor 20. Because a PMOS transistor has a larger parasitic sheet resistance in its channel than an NMOS transistor, the resistor of an RC circuit is usually implemented by a PMOS transistor. The output signal from the drain of the PMOS transistor connected as the resistor 22 is usually connected to an input line of cascaded inverters 24, that commonly include two NOT gates 240 and 242 connected in series. The cascaded inverters 24 are used to shape the signal connected to its input line to a better form, and the required signal POR* is then provided at the output line of the cascaded inverters 24.

The POR circuit of FIG. 2 can be fabricated with a peripheral circuit (not shown in this figure) in the same chip to reduce the total count of components on a system board. However, the area occupied by the resistor 22 and the capacitor 20 is very large compared with standard devices such as logic gates or flip-flops. For example, the typical parasitic capacitance of a PMOS transistor is 0.4 pF/$\mu$m$^2$. Consequently, an area of about 250,000 $\mu$m$_2$ is required to fabricate a capacitor having a capacitance of 0.1 $\mu$F. This occupied area is about the total area of 2200 two-input NAND gates for a 0.5 $\mu$m process. Further, the typical sheet resistance of the PMOS transistor is 2.5×10$^4$ ohms per square. Consequently, an area of about 80 $\mu$m$_2$ is required to fabricate a resistor having a resistance of 1 Mohm. Unfortunately, the area used for fabricating the capacitor will not shrink while the technology of the semiconductor industry progresses. Therefore, the area occupied by the PMOS capacitor becomes a dominant factor in determining the chip size.

SUMMARY OF THE INVENTION

In accordance with the present invention, a power-on reset circuit is provided. In one embodiment, the power-on reset circuit includes a first stage circuit and a second stage circuit. The first stage circuit includes an input terminal coupled to receive an input signal, a latch for detecting a power-on condition, and an output terminal for providing a first stage circuit output signal. The first stage circuit output signal remains in a first state after detection of the power-on condition. The second stage circuit includes an input terminal coupled to receive the first stage circuit output signal, a latch for detecting the power-on condition, and an output terminal for providing a second stage circuit output signal. The second stage circuit output signal remains in the first state after detection of the power-on condition. The first stage circuit output signal changes state from the first state to a second state when the input signal changes state from the second state to the first state, and the second stage circuit output signal changes state from the first state to the second state only the first time that the first stage circuit output signal changes state from the first state to the second state.

According to one aspect of the invention, the power-on reset circuit includes six equivalent two-input gates without an RC network. When used in a 0.5 $\mu$m process, this feature results in a power-on reset circuit that is about 1/360 the size of a conventional power-on reset circuit with an RC network.

According to another aspect of the invention, the input signal is suitably provided from an output terminal of an OR gate with input terminals coupled to receive a READ signal and a WRITE signal. The power-on reset circuit of the present invention is preferably incorporated in a peripheral circuit, such as a UART, a DMA controller, an interrupt controller, or a real-time clock.

BRIEF DESCRIPTION OF THE DRAWINGS

FIGS. 1A and 1B illustrate conventional timing diagrams of a power voltage and a power-on reset signal;

FIG. 2 shows a schematic diagram of a conventional POR circuit with an RC circuit fabricated in an integrated circuit;

FIGS. 4A through 4J show timing diagrams of signals of FIG. 3;

DETAILED DESCRIPTION OF THE PREFERRED EMBODIMENT

Figure 3:
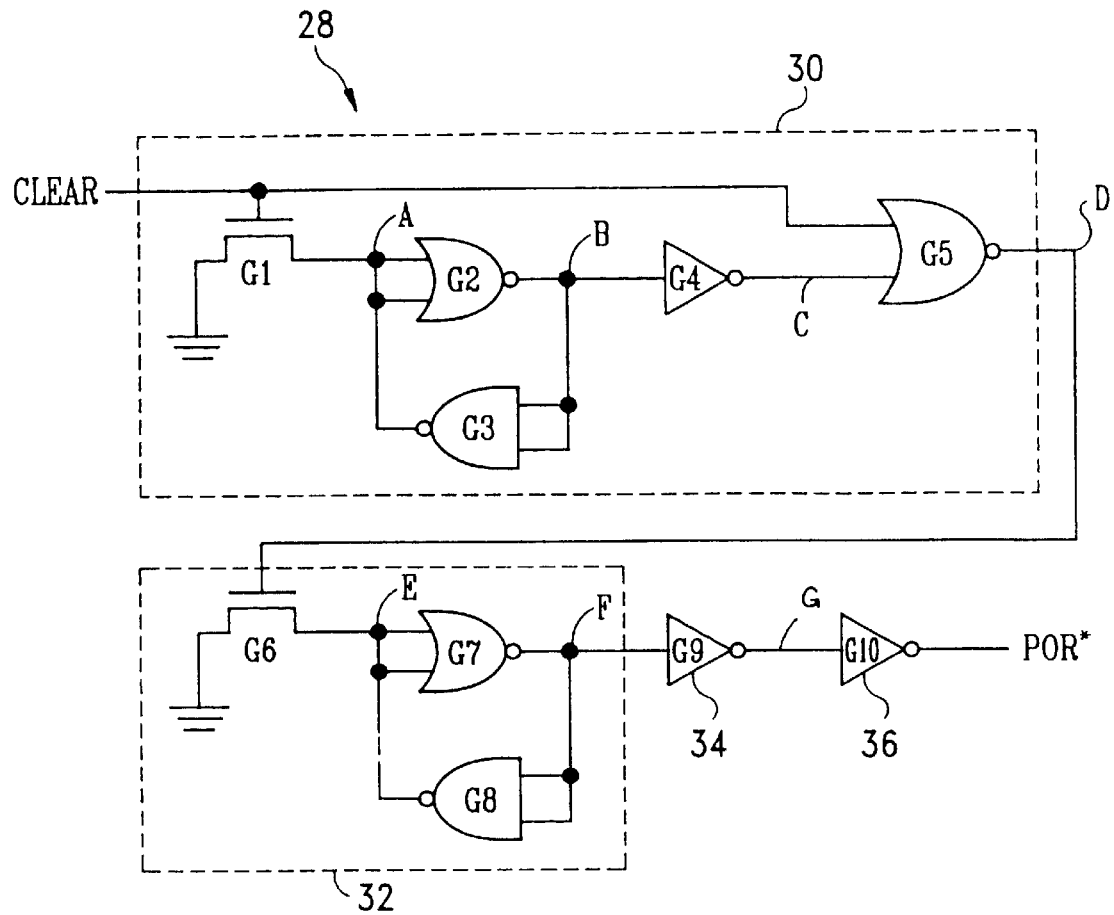
FIG. 3 shows a schematic diagram of a POR circuit according to the present invention.

FIG. 3 shows a schematical diagram of a power-on reset (POR) circuit 28 according one embodiment of the present invention. The POR circuit 28 includes a first stage circuit 30 and a second stage circuit 32. The first stage circuit 30 is configured as a latch to detect a power-on condition. More specifically, gate of an NMOS transistor G1 is used as an input terminal coupled to receive an input signal CLEAR, that will be described later. The transistor G1 has its source connected to ground, and its drain at a node A is connected to both input terminals of a standard two-input NOR gate G2. Both input terminals of a standard two-input NAND gate G3 are connected to receive the output signal of the NOR gate G2 at a node B. The output terminal of the NAND gate G3 is further connected to both input terminals of the NOR gate G2, therefore forming a closed loop that performs the function of the latch for the first stage circuit 30. A standard NOT gate G4 is connected to receive the output signal of the NOR gate G2. The output terminal (node C) of the NOT gate G4 is connected, along with the input signal CLEAR of the first stage circuit 30, to the input terminals of another two-input NOR gate G5, whose output terminal provides a first stage output signal at a node D.

The second stage circuit 32 is also configured as a latch to detect a power-on condition. The gate of an NMOS transistor G6 is connected to receive the first stage circuit output signal. The transistor G6 has its source connected to ground, and its drain is connected to both input terminals of a standard two-input NOR gate G7 at a node E. Both input terminals of a standard two-input NAND gate G8 are connected to receive the output signal of the NOR gate G7 at a node F. The output terminal of the NAND gate G8 is further connected to both input terminals of the NOR gate G7, therefore forming a closed loop that performs the function of the latch for the second stage circuit 32. The voltage at node F provides a second stage circuit output signal, which is then connected to the input terminal of a NOT gate G9. Cascaded NOT gates G9 and G10 together shape the second stage circuit output signal to a desired form, thereby generating the required power-on reset (POR*) signal, which is an active low logic signal.

Timing diagrams of pertinent signals are shown in FIGS. 4A through 4J. At time t1, the power is switched on, and supply voltage $V_{dd}$, represented by the waveform in FIG. 4A, rises from a logic low level. The supply voltage $V_{dd}$ reaches its stable logic high level at time t2. In the time period between time t1 and t2, the input signal CLEAR shown in FIG. 4B is maintained at logic low level. This causes the transistor G1 to turn off, and consequently isolates the node A from ground. The voltage at the node A, represented by the waveform in FIG. 4C, rises from a logic low level to a logic high level, while the voltage at node B, represented by the waveform in FIG. 4D, remains low because the transfer point of the NOR gate G2 is lower than that of the NAND gate G3. Consequently, the voltage at the node C, represented by the waveform in FIG. 4E, rises from a low level to a high level, and the voltage at the node D, represented by the waveform in FIG. 4F, remains low.

Similarly, the transistor G6 in the second stage circuit 32 is turned off by the first stage circuit 30 output signal, thereby isolating the node E. The voltage at the node E, represented by the waveform in FIG. 4G, rises from a low level to a high level, while the voltage at the node F, represented by the waveform in FIG. 4H, remains low because the transfer point of the NOR gate G7 is lower than that of the NAND gate G8. The voltage at the node G, represented by the waveform in FIG. 4I, rises from a low level to a high level, and the output signal POR* remains low.

At time t3, the input signal CLEAR transitions to a logic high level, which causes the node A to be discharged through the transistor G1. Consequently, the voltage at the node B goes high, and the voltage at the node C goes low. Therefore, the first stage circuit 30 output signal remains low. This sustains the voltages at the node E and the node F of the second stage circuit 32. It will be appreciated that the voltages at the node A, the node B, and the node C of the first stage circuit 30 will not change their values until the supply power is switched on again.

At time t4, the input signal CLEAR transitions again to the logic low level, causing the voltage at the node D to go high. It will be appreciated that during the time period between time t3 and t4, input/output write operations may be performed as desired, and the required signal POR* should not be generated at this period.

The high voltage at the node D causes the node E to be discharged through the transistor G6. Consequently, the voltage at the node F goes high, and the voltage at the node G goes low, resulting in a high output signal POR*. It will be appreciated that the voltages at the node E, the node F, the node G, and the output signal POR* will not change their values until the supply power is switched on again. For example, during the time period between time t5 and t6, a positive pulse of the input signal CLEAR is input, but the output signal POR* is not affected by this input, although the voltage at the node D is affected. Accordingly, the voltage at the node D is not the power-on reset output signal, but instead two stage circuits are desired. In a presently preferred embodiment, the POR circuit 28 includes six standard two-input gates without an RC network. When used in a 0.5 $\mu$m process, this results in a POR circuit that is about $\frac{1}{360}$ the size of a conventional power-on reset circuit with an RC network.

Figure 5:
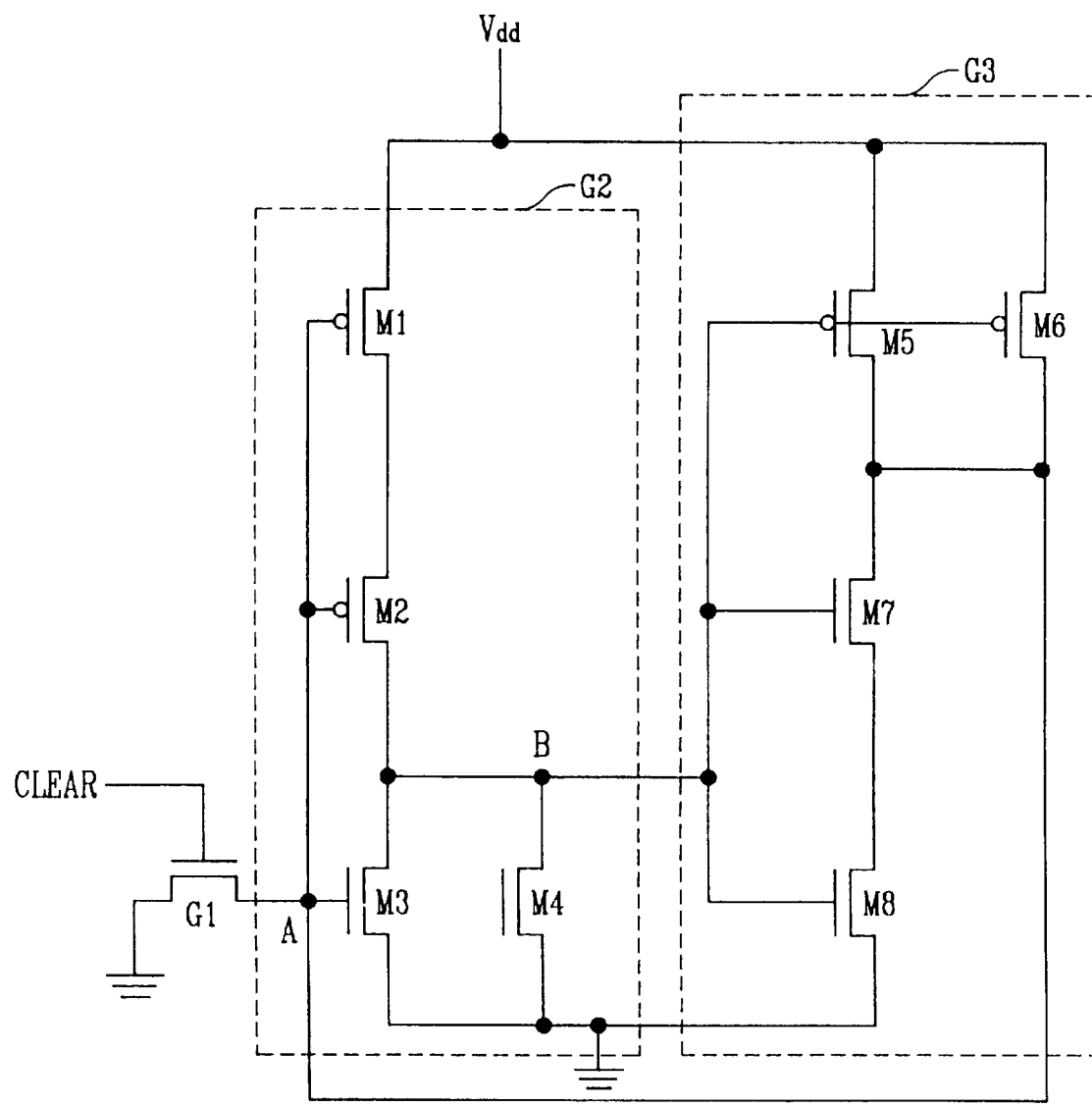
FIG. 5 shows a schematic diagram of one embodiment of the present invention implementing transistor G1, NOR gate G2, and NAND gate G3 shown in FIG. 4.

FIG. 5 shows a schematic diagram of the transistor G1, the NOR gate G2, and the NAND gate G3 shown in FIG. 4. In the configuration of the NOR gate G2, the size of the PMOS transistor M1 should not be too large. Otherwise the voltage at the node A will go low, contrary to the result illustrated in the time period ($t_1$–$t_2$) in FIG. 4C. On the other hand, the size of the transistor M1 should not be too small. Otherwise, the transistor M1 can not sink enough current to pull down the node A at time t3 as illustrated in FIG. 4C. In a presently preferred embodiment, the size of the transistor M1 is preferably an area in the range of about 10–20 $\mu$m. Assuming that all transistors have channel lengths that are about the same length, then the width of a PMOS transistor is about twice that of a NMOS transistor. Further, the nominal ratio of channel width of the transistor M1 and any other NMOS transistor is about 5.

Figure 6A:
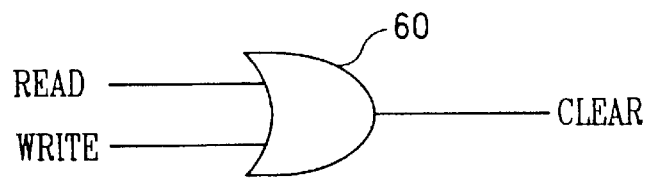
FIG. 6A shows a schematic diagram of a circuit for generating the input signal CLEAR.
Figure 6B:
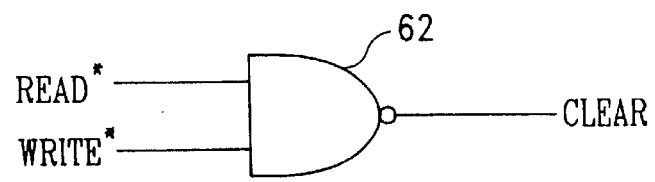
FIG. 6B shows another schematic diagram of a circuit for generating the input signal CLEAR.

FIG. 6A shows a schematic diagram illustrating the generation of the input signal CLEAR, that is input to the POR circuit 28 in a peripheral circuit, such as a universal asynchronous receiver/transmitter (UART), a direct memory access (DMA) controller, an interrupt controller, or a real-time clock. This input signal CLEAR is suitably provided from an output terminal of an OR gate 60 with input terminals coupled to receive a READ signal and a WRITE signal. Consequently, a high level signal CLEAR is generated at the first time that the peripheral circuit is read or written by a central processing unit (CPU), therefore generating signal POR* through the POR circuit 28 as shown in FIG. 3. FIG. 6B shows another circuit diagram schematically illustrating the generating of the input signal CLEAR when the read/write signal is an active low logic level. In this figure, a NAND gate 62 is used with input terminals coupled to receive a READ* signal and a WRITE* signal.

Although specific embodiments have been illustrated and described, it will be obvious to those skilled in the art that various modifications may be made without departing from the spirit which is intended to be limited solely by the appended claims.

What is claimed is:

1. A power-on reset circuit comprising:
    a first stage circuit for detecting a power-on condition, wherein the first stage circuit remains in a first state after detection of the power-on condition, and a first stage output signal generated from the first stage circuit changes state from the first state to a second state when an input signal changes state from the second state to the first state; and
    a second stage circuit coupled to the first stage circuit for detecting the power-on condition and generating a power-on reset signal, wherein the power-on reset signal remains in the first state after detection of the power-on condition, and the power-on reset signal changes state from the first state to the second state only the first time that the first stage circuit output signal changes state from the first state to the second state.

2. The power-on reset circuit according to claim 1, wherein said first stage circuit comprises:
    a first input terminal coupled to receive the input signal;
    a first latch configured to detect the power-on condition; and
    a first output terminal coupled to provide the first stage circuit output signal.

3. The power-on reset circuit according to claim 2, wherein said second stage circuit comprises:
    a second input terminal coupled to receive the first stage circuit output signal;
    a second latch configured to detect the power-on condition; and
    a second output terminal coupled to provide the power-on reset signal.

4. The power-on reset circuit according to claim 3, further comprising a waveform shaping circuit configured to shape the power-on reset signal.

5. The power-on reset circuit according to claim 4, wherein said waveform shaping circuit comprises:
    a first inverter having an input terminal connected to the second output terminal of the second stage circuit, the first inverter having an output terminal; and
    a second inverter having an input terminal connected to the output terminal of the first inverter, the second inverter having an output terminal to provide the shaped power-on reset signal.

6. The power-on reset circuit according to claim 3, wherein said power-on reset signal is further electrically coupled to a semiconductor circuit.

7. The power-on reset circuit according to claim 6, wherein said semiconductor circuit is selected from a group comprising a universal asynchronous receiver/transmitter, a direct memory access controller, an interrupt controller, and a real-time clock.

8. The power-on reset circuit according to claim 3, wherein said input signal is generated from an output terminal of an OR gate with input terminals coupled to receive a READ signal and a WRITE signal, the READ signal and the WRITE signal being provided by a central processing unit.

9. The power-on reset circuit according to claim 3, wherein said first stage circuit comprises:
    a first transistor having a gate connected to receive the input signal, a source connected to ground, and an output terminal;
    a first NOR gate having two input terminals connected to the output terminal of the first transistor, and an output terminal;
    a first NAND gate having two input terminals connected to the output terminal of the first NOR gate, and an output terminal connected to the output terminal of the first transistor;
    a NOT gate having an input terminal connected to the output terminal of the first NOR gate, and an output terminal; and
    a second NOR gate having a first input terminal connected to receive the input signal, a second input terminal connected to the output terminal of the NOT gate, and an output terminal to provide the first stage circuit output signal.

10. The power-on reset circuit according to claim 9, wherein said second stage circuit comprises:
    a second transistor having a gate connected to receive the first stage circuit output signal, a source connected to ground, and an output terminal;
    a third NOR gate having two input terminals connected to the output terminal of the second transistor, and an output terminal; and
    a second NAND gate having two input terminals connected to the output terminal of the third NOR gate, and an output terminal connected to the output terminal of the second transistor, the output terminal of the third NOR gate providing the power-on reset signal.

11. A power-on reset circuit comprising:
    a first stage circuit having
        a first input terminal coupled to receive an input signal;
        a first latch configured to detect a power-on condition; and
        a first output terminal coupled to provide a first stage circuit output signal, wherein the first stage circuit output signal remains in a first state after detection of the power-on condition, and the first stage circuit output signal changes state from the first state to a second state when the input signal changes state from the second state to the first state; and
    a second stage circuit having
        a second input terminal coupled to receive the first stage circuit output signal;
        a second latch configured to detect the power-on condition; and a second output terminal coupled to provide a power-on reset signal, wherein the power-on reset signal remains in the first state after detection of the power-on condition, and the power-on reset signal changes state from the first state to the second state only the first time that the first stage circuit output signal changes state from the first state to the second state.

12. The power-on reset circuit according to claim 11, further comprising a waveform shaping circuit configured to shape the power-on reset signal.

13. The power-on reset circuit according to claim 12, wherein said waveform shaping circuit comprises:
a first inverter having an input terminal connected to the second output terminal of the second stage circuit, the first inverter having an output terminal; and
a second inverter having an input terminal connected to the output terminal of the first inverter, the second inverter having an output terminal to provide the shaped power-on reset signal.

14. The power-on reset circuit according to claim 11, wherein said power-on reset signal is fuirther electrically coupled to a semiconductor circuit.

15. The power-on reset circuit according to claim 14, wherein said semiconductor circuit is selected from a group comprising a universal asynchronous receiver/transmitter, a direct memory access controller, an interrupt controller, and a real-time clock.

16. The power-on reset circuit according to claim 11, wherein said input signal is generated from an output terminal of an OR gate with input terminals coupled to receive a READ signal and a WRITE signal, the READ signal and the WRITE signal being provided by a central processing unit.

17. The power-on reset circuit according to claim 11, wherein said first stage circuit comprises:
a first transistor having a gate connected to receive the input signal, a source connected to ground, and an output terminal:
a first NOR gate having two input terminals connected to the output terminal of the first transistor, and an output terminal;
a first NAND gate having two input terminals connected to the output terminal of the first NOR gate, and an output terminal connected to the output terminal of the first transistor;
a NOT gate having an input terminal connected to the output terminal of the first NOR gate, and an output terminal; and
a second NOR gate having a first input terminal connected to receive the input signal, a second input terminal connected to the output terminal of the NOT gate, and an output terminal to provide the first stage circuit output signal.

18. The power-on reset circuit according to claim 17, wherein said second stage circuit comprises:
a second transistor having a gate connected to receive the first stage circuit output signal, a source connected to ground, and an output terminal;
a third NOR gate having two input terminals connected to the output terminal of the second transistor, and an output terminal; and
a second NAND gate having two input terminals connected to the output terminal of the third NOR gate, and an output terminal connected to the output terminal of the second transistor, the output terminal of the third NOR gate providing the power-on reset signal.

19. A power-on reset circuit comprising:
a first stage circuit for detecting a power-on condition, wherein the first stage circuit remains in a first state after detection of the power-on condition, and a first stage output signal generated from the first stage circuit changes state from the first state to a second state when an input signal changes state from the second state to the first state; and
a second stage circuit coupled to the first stage circuit for detecting the power-on condition and generating a power-on reset signal, wherein said second stage circuit includes means for generating a signal that changes state from the second state to the first state responding only to the first time when the first stage circuit output signal changes state from the first state to the second state, and wherein the power-on reset signal remains in the first state after detection of the power-on condition, and the power-on reset signal changes state from the first state to the second state only the first time that the first stage circuit output signal changes state from the first state to the second state.

20. The power-on reset circuit according to claim 19, wherein said first stage circuit comprises:
a first input terminal coupled to receive the input signal;
a first latch configured to detect the power-on condition; and
a first output terminal coupled to provide the first stage circuit output signal.

21. The power-on reset circuit according to claim 20, wherein said second stage circuit comprises:
a second input terminal coupled to receive the first stage circuit output signal;
a second latch configured to detect the power-on condition; and
a second output terminal coupled to provide the power-on reset signal.

22. The power-on reset circuit according to claim 21, further comprising a waveform shaping circuit configured to shape the power-on reset signal.

23. The power-on reset circuit according to claim 22, wherein said waveform shaping circuit comprises:
a first inverter having an input terminal connected to the second output terminal of the second stage circuit, the first inverter having an output terminal; and
a second inverter having an input terminal connected to the output terminal of the first inverter, the second inverter having an output terminal to provide the shaped power-on reset signal.

* * * * *